United States Patent [19]

Contiero et al.

[11] Patent Number: 4,718,977
[45] Date of Patent: Jan. 12, 1988

[54] PROCESS FOR FORMING SEMICONDUCTOR DEVICE HAVING MULTI-THICKNESS METALLIZATION

[75] Inventors: Claudio Contiero, Buccinasco; Giulio Iannuzzi, Vimercate; Giorgio De Santi, Milan; Fabrizio Andreani, Parma, all of Italy

[73] Assignee: SGS Microelettronica S.p.A., Agrate, Italy

[21] Appl. No.: 773,319

[22] Filed: Sep. 6, 1985

[30] Foreign Application Priority Data

Dec. 20, 1984 [IT] Italy ................ 24139 A/84

[51] Int. Cl.[4] .............. H01L 21/28; H01L 29/44; C23F 1/02
[52] U.S. Cl. .................... 156/652; 156/656; 156/659.1; 156/661.1; 156/665; 430/318; 437/228
[58] Field of Search ........ 156/652, 656, 661.1, 156/664, 665, 659.1; 427/89, 90; 430/316, 318; 428/620, 651; 357/71

[56] References Cited

U.S. PATENT DOCUMENTS

| | | | |
|---|---|---|---|
| 3,562,604 | 2/1971 | Van Laer | 427/90 |
| 3,700,510 | 10/1972 | Keene et al. | 156/652 |
| 4,000,842 | 1/1977 | Burns | 357/71 |
| 4,233,337 | 11/1980 | Friedman et al. | 427/89 |
| 4,495,026 | 1/1985 | Herberg | 156/652 |
| 4,536,951 | 8/1985 | Rhodes et al. | 427/89 X |
| 4,556,897 | 12/1985 | Yorikane et al. | 357/71 |

FOREIGN PATENT DOCUMENTS 52-149990 12/1977 Japan .
WO82/01102 4/1982 PCT Int'l Appl. ........ 357/71

Primary Examiner—S. Leon Bashore
Assistant Examiner—Andrew J. Anderson
Attorney, Agent, or Firm—Harry M. Weiss & Associates

[57] ABSTRACT

Structure and method for metallization patterns of different thicknesses on a semiconductor device or integrated circuit. The improved structure and method utilizes three layers of metal in order to reduce the required number of processing steps. One preferred embodiment entails a single metal deposition sequence followed by two etch steps, while a second embodiment, suitable for thicker metallization, requires only two depositions and two etch steps.

3 Claims, 6 Drawing Figures

PROCESS FOR FORMING SEMICONDUCTOR DEVICE HAVING MULTI-THICKNESS METALLIZATION

BACKGROUND OF THE INVENTION

1. Field of the Invention

This invention relates generally to semiconductor devices having different metallization thicknesses on different portions of the device surface, and, more particularly, to semiconductor integrated circuits having a thin patterned metal over a portion of a circuit having a complex metal pattern and a thick patterned metal over a portion of the circuit having a relatively simple metal pattern.

2. Brief Description of the Prior Art

In the past, semiconductor devices and integrated circuits have generally been made with a single-thickness metal interconnect pattern for electrically linking all the components in the substrate. Many integrated circuits, however, combine control circuitry and power devices on the same substrate. As the dimensions of the components have shrunk and the current-carrying demands on the power devices have escalated with advances in the state of the art, it has become highly desirable to use at least two thicknesses of metal in such circuits. A relatively thin layer of metal is deposited over the complex portion of the circuit, such as the control circuitry. The relatively thin metal facilitates patterning into the relatively fine lines required to maintain a high density in the low-power portion of the integrated circuit. A substantially thicker metal is deposited and patterned over the power output or high current portion of the integrated circuit. Here there is less requirement for very fine lines but a substantially thicker metal is deposited and patterned over the power output or high current portion of the integrated circuit. Here there is less requirement for very fine lines but a substantial need to minimize internal voltage drops which waste power and disturb the current distribution within the power device.

In the past, such a dual-thickness metallization scheme has been implemented by a sequence of deposition and patterning steps. First, a thin layer of metal is deposited and patterned to form the interconnects over all of the circuit. Then, an insulator layer, typically chemical vapor deposited oxide, is put down over the first layer of metal and patterned to expose those portions of the first layer metal pattern which needs to be contacted by the thicker layer. Then the thicker layer of metal is deposited and patterned to leave it only in the desired regions. Thus, a total of three deposition steps and three patterning steps have been utilized to provide a dual-thickness metallization scheme. Such a scheme is expensive, and in addition leads to other problems, such as the mechanical strength of the thick-metal portions over the deposited oxide.

Thus, a need has existed for a better structure and process suitable for providing at least two different metallization thicknesses in two or more different portions of a semiconductor device or integrated circuit without incurring the relatively high cost or poor performance of known systems.

SUMMARY OF THE INVENTION

It is an objective of the present invention to provide patterned metal layers of at least two different thicknesses on the same semiconductor substrate at relatively low cost and without substantial adherence problems.

It is yet another objective of the present invention to provide patterned metal layers of at least two different thicknesses on the same semiconductor chip without the use of a deposited insulator in the structure and method for forming the patterned metal layers.

It is still another objective of the present invention to reduce the number of process steps required to provide patterned metal layers of at least two different thicknesses on a single semiconductor substrate.

It is yet a further objective of the present invention to reduce the number of metal deposition steps required to provide patterned metal layers of at least two different thicknesses in a single semiconductor integrated circuit.

It is still another objective of this invention to provide a structure and method for supplying patterned metal layers of at least two different thicknesses on a single semiconductor substrate by the use of but a single metal deposition step.

In accordance with one embodiment of this invention, a three layer metallization is provided with at least the middle one of said layers being of a different composition than the other two to prevent etching of the bottom layer when the top layer is patterned by chemical etching.

In accordance with a preferred embodiment of this invention, three metal layers are provided in a single deposition sequence, and a first mask used to pattern thick metal portions by etching through the top two metal layers. A second mask is then used to provide thin metal layers. A second mask is then used to provide thin metal portions by patterning the lower metal layer.

In accordance with another preferred embodiment of this invention, a structure comprising three metal layers is provided by depositing and etching a first metal layer to form a first metallization pattern comprising a relatively thin layer. Two additional metal layers are then deposited on the first layer and masked and etched to form a second metal pattern comprising a relatively thick metal layer. The intermediate metal layer prevents chemical attack of the lower layer while forming the pattern in the upper layer.

The foregoing and other objects, features, and advantages will be apparent from the following, more particular description of the preferred embodiments of the invention, as illustrated in the accompanying drawings.

DETAILED DESCRIPTION OF THE INVENTION

Figure 1:
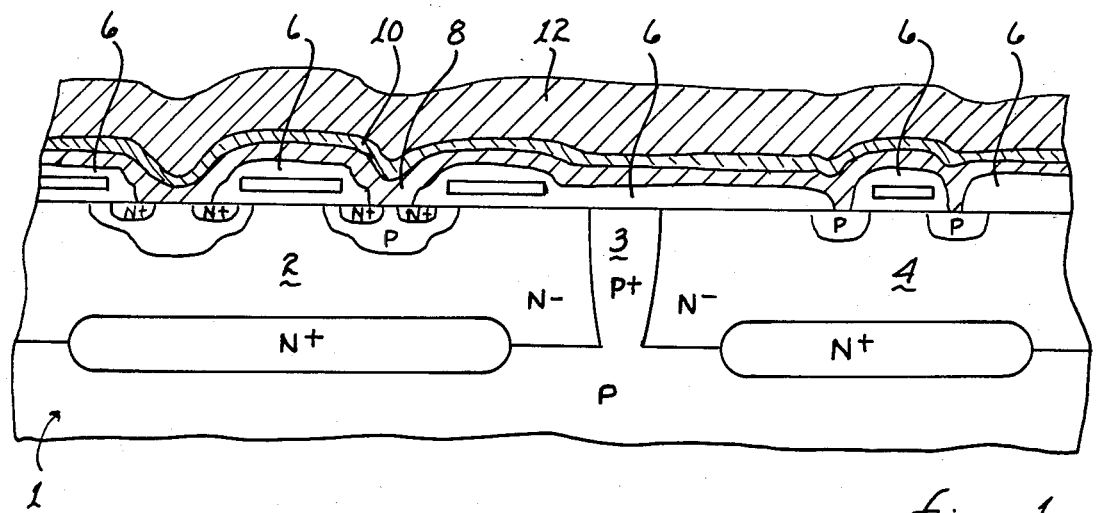
FIGS. 1-3 comprise cross-sectional views of a metallized integrated circuit according to a first preferred process sequence of the present invention.

Referring now to FIG. 1, there is shown a cross-sectional side view of a semiconductor substrate 1. In this illustration, the semiconductor substrate comprises an integrated circuit comprising isolated n-type tub regions 2 and 4 separatued by a p-type region 3. Various dopant introduction steps well-known in the art have been employed to introduce additional doped regions into the top surface of the substrate 1 in isolated tubs 2 and 4. In this example, tub region 4 contains various low-level MOS (metal-oxide-semiconductor) drive circuitry, while tub region 2 contains a power MOS semiconductor device. Such a division between low-level circuitry, which desirably entails a dense metalization pattern, and power circuitry, requiring more current-carrying capability in the metal, is commonplace in contemporary integrated circuits. A very fine geometry metal pattern is required to save space in the low-level portion of the circuitry, while the metal over the power portion or portions of the integrated circuit must be relatively thick in order to carry the requisite currents. Thus the semiconductor device metallization is desirably thicker over the power portion of the integrated circuit than over the low-level portion, where a thinner metallization layer facilitates patterning of the finer geometries.

FIG. 1 shows the semiconductor device after the first of three processing steps in a method for producing a multithickness metallization according to the present invention. First layer 8 of deposited metallization is desirably an aluminum-comprising film which contacts the various devices comprising the exemplary integrated circuit. The thickness of this layer is preferably in the range of 0.5 to 1.0 micrometers, and the aluminum layer 8 may include small amounts of other elements such as silicon and copper in order to reduce reactions with the semiconductor substrate devices and to retard electromigration. Next, a layer 10 of titanium metal having a thickness in the range of 0.1 to 0.2 micrometers is deposited over the first aluminum-comprising layer 8. Lastly, a relatively thick aluminum-comprising film 12 is deposited over the first two metal layers. In this example, the aluminum film is about 3 micrometers thick, but it could be thicker or thinner depending on the current carrying requirements. Again, the metal layer 10 comprising aluminum may also include small percentages of other elements such as copper and silicon for the reasons mentioned hereinbefore. Oxide layer 6 is under metal layer 8.

Figure 2:
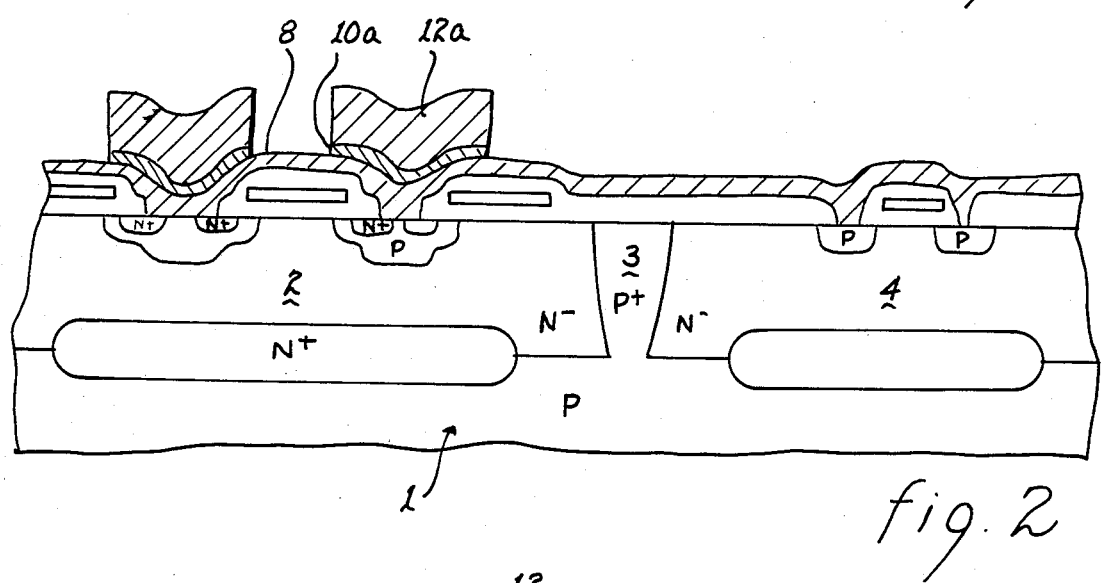

Referring now to FIG. 2, the integrated circuit is shown after a photolithographically-defined etch step which removed all of aluminum comprising layer 12 over the low-level portions of the circuitry 4, and selected portions over the power portion of the circuitry 2, leaving the thick patterned metal regions 12a. By selecting an etch which attacks the aluminum-comprising layer 12 in order to expose the aluminum-comprising layer 8 for the patterning step necessary to form the fine-geometry metallization pattern, the titanium film 10 not covered by aluminum metal regions 12A is etched away by a reactant which does not significantly attack aluminum.

Figure 3:
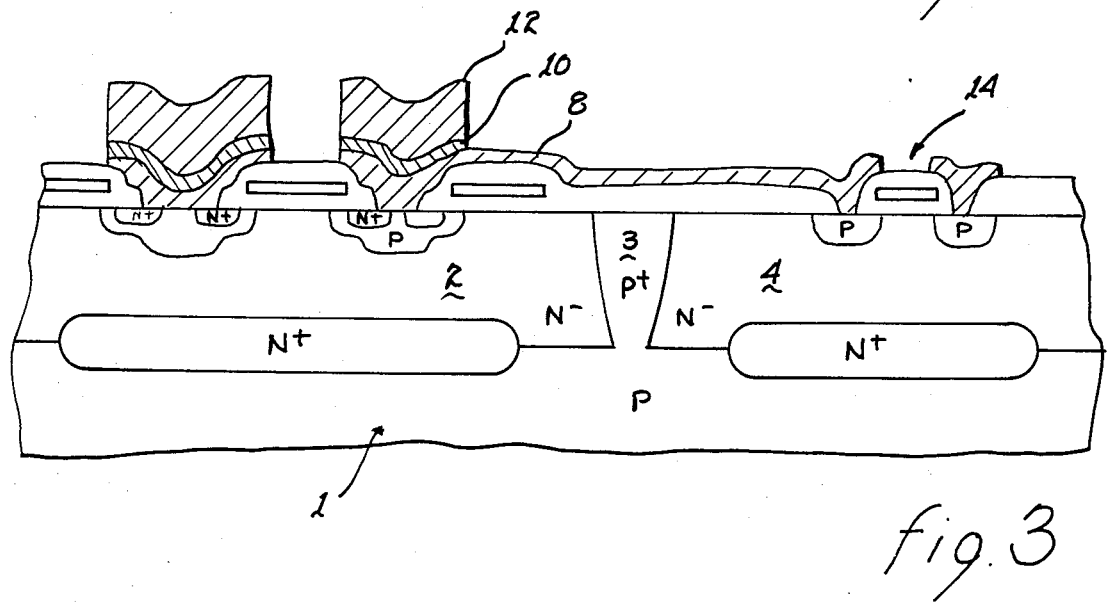

Referring now to FIG. 3, a photolithographically-assisted etch step has been used to etch the aluminum comprising layer 8 into the relatively-fine geometry pattern 14 over the low-level circuitry 4. Thus the finished integrated circuit semiconductor device comprises three metal layers patterned to form a relatively thick metallization pattern over the power portion of the circuit, and a single metal layer comprising a relatively fine geometry pattern in the relatively thin metallization over the low-level portion of the integrated circuit. Note that while aluminum or aluminum alloys and titanium have been used in the foregoing example, any combination of metal layers that have the exemplary differential resistance to suitable etchants may be employed.

Figure 5:
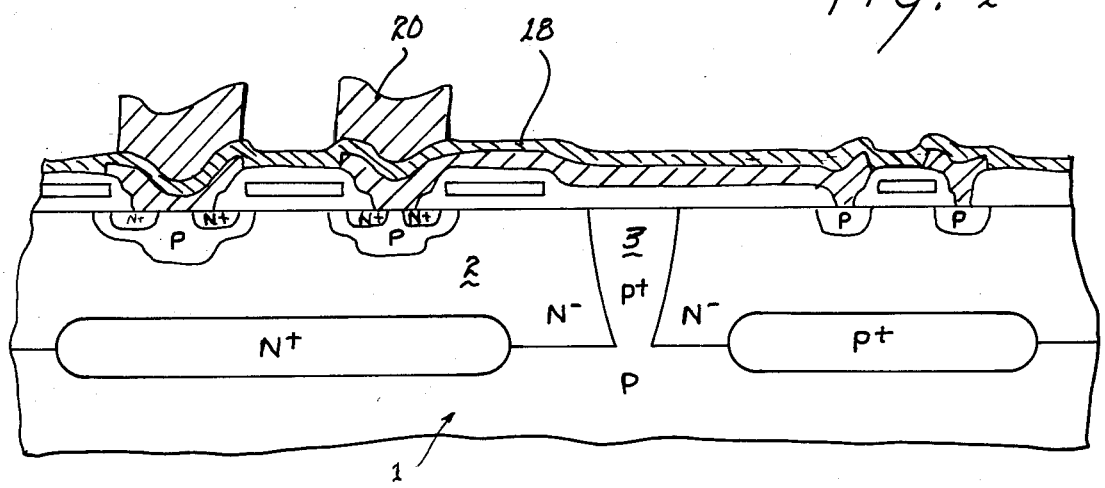
Figure 6:
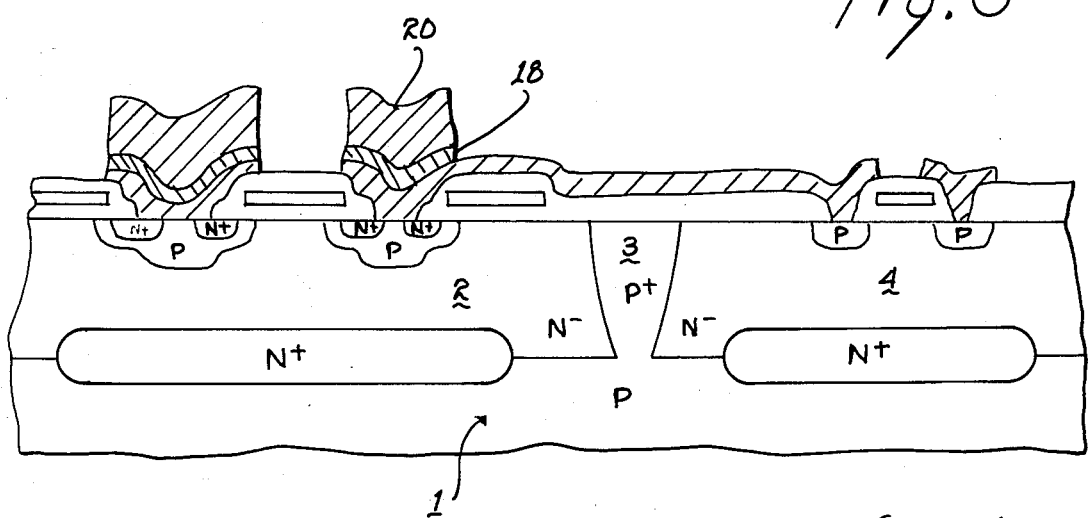

The structure and process shown by FIGS. 1-3 is very simple, as all the three metal layers may be deposited in a single metal deposition sequence, and only two patterned etch steps are required. The chief limitation of this embodiment of the present invention is that rather large steps may be present after the top layer 12 of metallization is etched. Then when the photoresist is applied to form the pattern in the bottom layer 8 of the metallization, breaks may occur at the rather large steps and undesired attack of the metal pattern over the power device may take place. Thus in the case where the top layer of metallization 12 is quite thick, another preferred embodiment of the present invention, as illustrated by FIGS. 4-6, may be more applicable.

Figure 4:
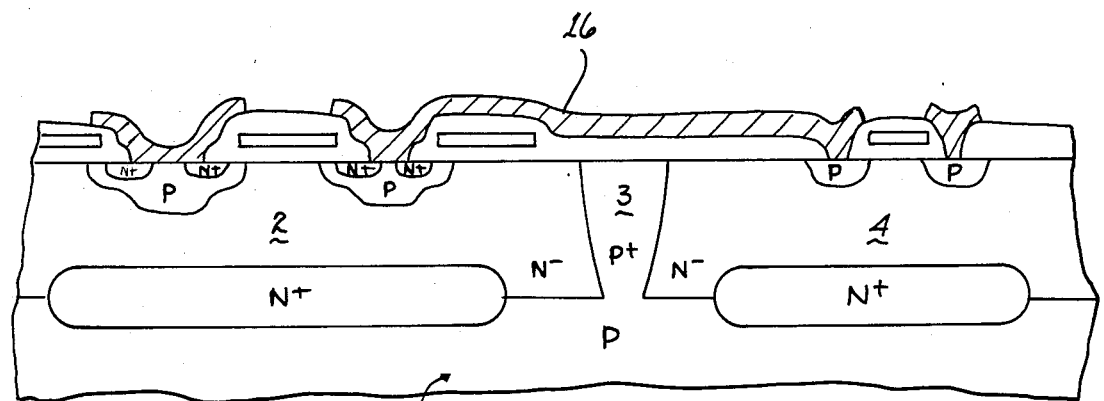
FIGS. 4-6 comprises cross-sectional views of a metallized integrated circuit according to a second preferred process sequence of this invention.

Referring now to FIG. 4, a first relatively thin layer 16 of aluminum or an aluminum alloy has been deposited over the entire wafer and patterned and etched to form the metallization patterns over both the power portion and the low-level portion of the integrated circuit. After this patterning step, a thin layer of titanium 18 and a relatively thick layer 20 of aluminum or an aluminum alloy are deposited as shown by FIG. 5. The top layer 20 has been patterned to remove it completely over the low-level portion 4 of the integrated circuit and to form the desired conductor pattern over the power device 2. Again, as in the first preferred embodiment, the titanium layer 18 prevents the etchant from attacking the underlying pattern in layer 16. The titanium is then stripped in an etchant which attacks aluminum only slowly to result in the finished structure of FIG. 6. The second preferred embodiment thus has split up the metallization sequence of the first preferred embodiment.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming an integrated circuit metallization pattern including a first conductor portion having a relatively fine conductor pattern and a second metal portion thicker than said first conductor portion and having a relatively coarse conductor pattern comprising the steps of:
   depositing an aluminum comprising first metal layer having a first thickness;
   depositing a titanium comprising second metal layer having a thickness substantially less than said first metal layer on said first metal layer;
   depositing an aluminum comprising third metal layer having a thickness substantially greater than said first metal layer on said second metal layer;
   forming a first photoresist mask on said first metal layer;
   etching said first layer using said first photoresist mask to form said relatively fine conductor pattern;
   forming a second photoresist mask on said third metal layer; and
   etching said third metal layer using said second photoresist mask to form said relatively coarse conductor pattern and using only said second metal layer to prevent attack of said first metal layer in said first conductor portion having a relatively fine conductor pattern.

2. The method according to claim 1, where said step of etching said first layer is carried out prior to said second and third metal layer depositing steps.

3. The method according to claim 1, where said step of etching said first layer is carried out after completely removing said second metal layer over the area to be occupied by said first conductor pattern having a relatively fine conductor pattern.

* * * * *